United States Patent
Douskey et al.

(10) Patent No.: US 9,151,800 B2
(45) Date of Patent: Oct. 6, 2015

(54) CHIP TESTING WITH EXCLUSIVE OR

(71) Applicant: International Business Machines Corporation, Armonk, NY (US)

(72) Inventors: Steven M. Douskey, Rochester, MN (US); Mary P. Kusko, Hopewell Junction, NY (US); Cedric Lichtenau, Stuttgart (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/109,258

(22) Filed: Dec. 17, 2013

(65) Prior Publication Data

US 2015/0089312 A1    Mar. 26, 2015

Related U.S. Application Data

(63) Continuation of application No. 14/033,973, filed on Sep. 23, 2013.

(51) Int. Cl.
  *G01R 31/28* (2006.01)
  *G01R 31/3177* (2006.01)
  *G01R 31/3185* (2006.01)

(52) U.S. Cl.
  CPC .... *G01R 31/3177* (2013.01); *G01R 31/318533* (2013.01); *G01R 31/318544* (2013.01); *G01R 31/318566* (2013.01)

(58) Field of Classification Search
  None
  See application file for complete search history.

(56) References Cited

U.S. PATENT DOCUMENTS

| | | | | |
|---|---|---|---|---|
| 5,717,701 A | * | 2/1998 | Angelotti et al. | 714/30 |
| 6,415,409 B1 | * | 7/2002 | Rhodes et al. | 714/738 |
| 6,477,676 B1 | * | 11/2002 | Rhodes et al. | 714/743 |
| 7,007,213 B2 | * | 2/2006 | Wang et al. | 714/729 |
| 7,337,379 B2 | * | 2/2008 | Hiraide | 714/724 |
| 7,395,473 B2 | | 7/2008 | Cheng et al. | |
| 7,412,637 B2 | | 8/2008 | Wang et al. | |
| 7,451,373 B2 | | 11/2008 | Poehl et al. | |
| 7,552,373 B2 | | 6/2009 | Wang et al. | |

(Continued)

OTHER PUBLICATIONS

Reungpeerakul et al., "BCH-based Compactors of Test Responses with Controllable Masks", 15th Asian Test Symposium (ATS '06), IEEE Computer Society, © 2006 IEEE. DOI: 10.1109/ATS.2006.260961.

(Continued)

*Primary Examiner* — Daniel McMahon
(74) *Attorney, Agent, or Firm* — Penny L. Lowry; Robert Williams

(57) ABSTRACT

First and second scan channels each comprise a plurality of scannable latches that apply input to and receive output from logic circuits on a chip under test. First input is scanned into the first scan channel and second input is scanned into the second scan channel. Output from the first scan channel is hashed using a first XOR on the first scan channel and output from the second scan channel is hashed using a first XOR on the second scan channel. Output from the first XOR on the first scan channel is hashed using a second XOR on the first scan channel. A rotator creates adjustment data from the output from the second XOR on the first scan channel. The adjustment data and output from the first XOR on the second scan channel are hashed using a second XOR on the second scan channel.

13 Claims, 3 Drawing Sheets

(56) References Cited

U.S. PATENT DOCUMENTS

| | | | |
|---|---|---|---|
| 7,925,947 B1* | 4/2011 | Touba et al. | 714/732 |
| 8,030,649 B2* | 10/2011 | Gschwind | 257/48 |
| 8,086,923 B2 | 12/2011 | Cheng et al. | |
| 8,286,040 B2* | 10/2012 | Malach et al. | 714/726 |
| 8,959,001 B2 | 2/2015 | Inoue et al. | |
| 2003/0110431 A1* | 6/2003 | Davies et al. | 714/726 |
| 2003/0154433 A1* | 8/2003 | Wang et al. | 714/726 |
| 2003/0163773 A1* | 8/2003 | O'Brien et al. | 714/726 |
| 2004/0064771 A1* | 4/2004 | Appinger et al. | 714/733 |
| 2007/0168803 A1* | 7/2007 | Wang et al. | 714/726 |
| 2009/0235132 A1 | 9/2009 | Wang et al. | |
| 2015/0089311 A1 | 3/2015 | Douskey et al. | |

OTHER PUBLICATIONS

Reungpeerakul et al., "BCH-based Compactors with Data Compression", Proceedings of the ECTI-CON 2008, 5th International Conference on Electrical Engineering/Electronics, Computers, Telecommunications and Information Technology, 2008, vol. 2, © 2008 IEEE. DOI: 10.1109/ECTICON.2008.4600524.

Vierhaus et al., "Embedded Diagnostic Logic Test Exploiting Regularity", 11th Euromicro Conference on Digital System Design Architectures (DSD '08), IEEE Computer Society, pp. 873-879, © 2008 IEEE. DOI: 10.1109/DSD.2008.124.

Douskey et al., "Chip Testing with Exclusive Or," U.S. Appl. No. 14/033,973, filed Sep. 23, 2013, IBM.

\* cited by examiner

CHIP TESTING WITH EXCLUSIVE OR

CROSS-REFERENCE TO RELATED APPLICATIONS

This application is a continuation of co-pending U.S. patent application Ser. No. 14/033,973, filed Sep. 23, 2013. The aforementioned related patent application is herein incorporated by reference in its entirety.

TECHNICAL FIELD

Embodiments described herein generally relate to electronic components, and more specifically, to testing electronic components.

BACKGROUND

Circuits can be prone to defects introduced during a manufacturing process. To test for defects, a scan input may be applied to scan channels, and the result of the scan input that is applied to the scan channels may be analyzed. The test may include large numbers and variations of scan inputs being applied to scan channels of the circuit. The tests may take a great amount of time, produce large amounts of data for analysis, and require large amounts of resources for that analysis.

SUMMARY

A system and method of testing a chip is disclosed. The method may include scanning input data into a first scan channel serially connected to a second scan channel. The scan channels may comprise a plurality of scannable latches, configured to scan input data to apply to logic circuits on the chip and to receive outputs from the logic circuits. The method may include outputting a data from the first scan channel to a first rotator. The method may include creating adjustment data using the data from the first scan channel by the rotator and the transmitting of the adjustment data to a second XOR on the second scan channel. The method may exclusive or the adjustment data from the first rotator with an output of the first XOR of the second scan channel, wherein the first XOR hashes output data from the scannable latches of the second scan channel.

The embodiments of a system for testing a chip may include a test structure for testing a chip. The system may include a first scan channel and a second scan channel serially connected to the first scan channel, and a first rotator to receive a data from the serially connected first scan channel and use the data to create an adjustment data for transmittal to the second scan channel. The system may further include the second scan channel comprising a plurality of scannable latches, configured to input an input data to logic circuits on a chip and to receive output data from logic circuits on the chip. The second scan channel may further comprise of a first exclusive or (XOR) to hash output data from the scannable latches, and a second XOR to exclusive or the adjustment data from the first rotator with an output of the first exclusive or.

BRIEF DESCRIPTION OF THE DRAWINGS

Features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments may be practiced and to further enable those of skill in the art to practice the invention. It is also to be understood that the descriptions of the embodiments are provided by way of example only, and are not intended to limit the scope of this invention as claimed. The figures of the accompanying drawings like reference numerals may refer to similar elements or steps.

DETAILED DESCRIPTION

A number of defects may be created during the manufacturing of a digital integrated circuit (IC). These defects may affect the logic output of the digital IC, which in turn adversely influences semiconductor chip quality and costs. Industry has developed a number of testing techniques to test for the defects. These techniques may rely on a test structure built into a chip. Cycling and analyzing output from the circuits on the chip may be time consuming and resource intensive. In various embodiments, a first exclusive or (XOR) may be used to hash the data from a second scan channel and a second XOR may be used on the first XOR output and adjustment data from a rotator that uses output from a serially connected first scan channel so that output from the scan channel may make it quicker or more efficient to find errors in the chip during testing. The use of double XORs and the adjustment data from the rotator may make locating errors with regards to specific scan channels or elements of scan channels more efficient. The use of the rotated data from the rotator combined or used with the second XOR may be used to hash the data from the second scan channel so that the error and the location may be quickly identified. This may reduce the number, variety, or time of testing done to the chip.

The test structure may connect to individual scan channels. An input, sometimes known as a test vector, from the test structure may produce an output on the scannable latches. In various embodiments, the output of the scannable latches may be compared against an expected result for the circuit being tested. The comparison may be done by an analysis system in communication with the scan channel. In some embodiments, the test structure may be part of a Logic Built In Self Test (LBIST) system.

Figure 1:
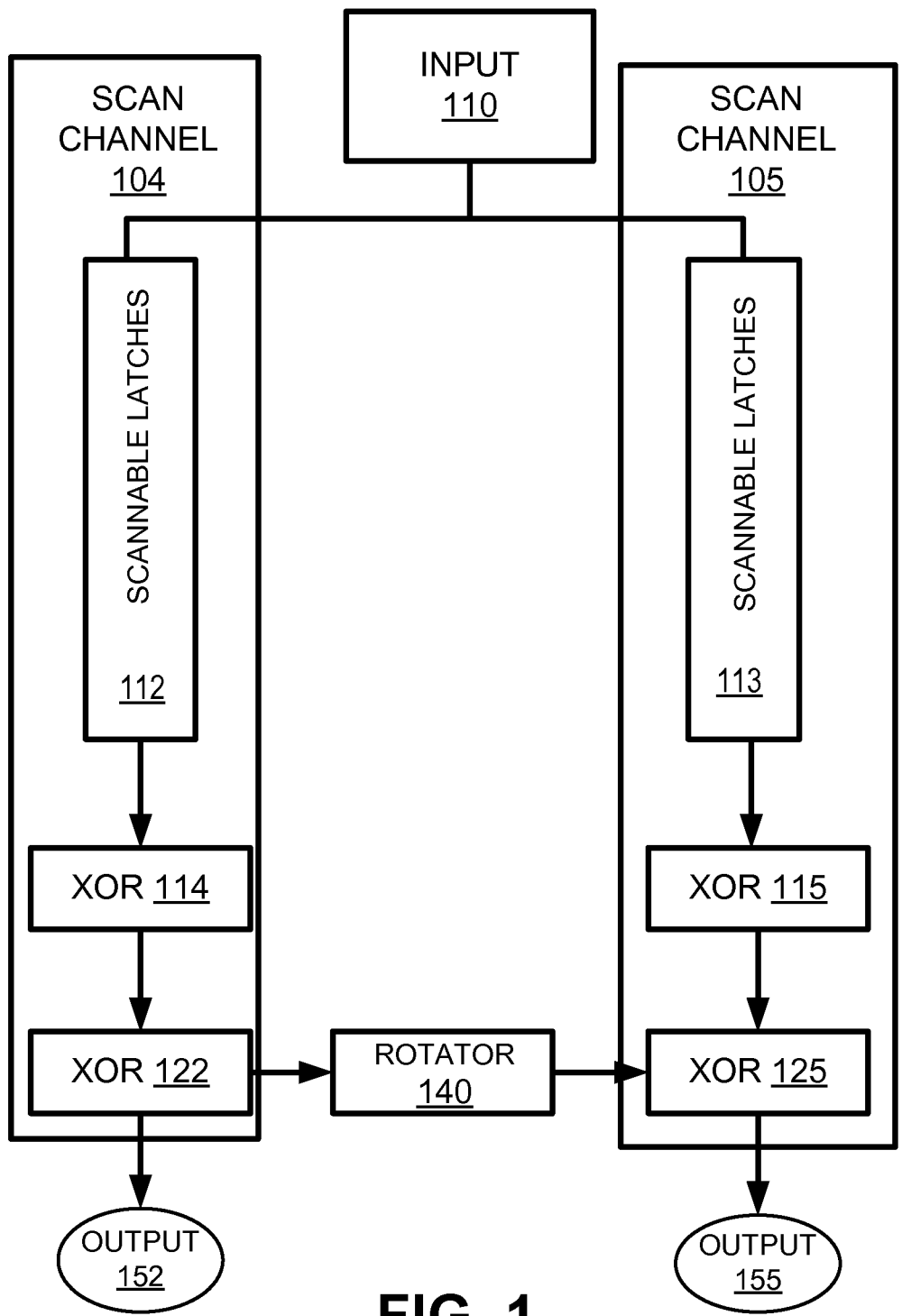
FIG. 1 depicts a high-level block diagram of an exemplary test structure, according to an embodiment.

FIG. 1 shows an embodiment of a test structure 100 that may be used to test scan channels, first scan channel 104 and second scan channel 105, on a chip. The test structure 100 may also include a rotator 140 in communication with both first scan channel 104 and second scan channel 105. The first scan channel 104 and second scan channel 105 may receive input 110 and with respective outputs 152 and 155. In various embodiments, first scan channel 104 or second scan channel 105 may represent sets of channels.

In the illustrated embodiment, first scan channel 104 may include a first plurality of scannable latches 112, a first XOR of the first scan channel 114, and a second XOR of the first scan channel 122. The second scan channel 105 may include a second plurality of scannable latches 113, a first XOR of the second scan channel 115, and a second XOR of the second scan channel 125. Both the first scan channel 104 and second scan channel 105 may receive input 110. The input 110 may, in various embodiments, be from a controller that manages the scan channels 104 and 105. In various embodiments, the input to the first scan channel 104 and second scan channel 105 may be the same or different.

In various embodiments, scannable latches 112 and 113 may be configured to receive input data, such as input 110, to apply to logic circuits on the chip and to receive outputs from logic circuits on the chip. In various embodiments the scan channels 104 and 105 may include any number of scannable latches 112 and 113. In various embodiments, scannable latches 112 and 113 may be referred to as logic elements. Scannable latches 112 may be in communication with logic circuits on a chip. Logic circuits may not be of equal number to scannable latches 112 or 113. In various embodiments, logic circuits may be used, assigned, or in communication with specific scannable latches of 112 or 113 or they may be shared by scannable latches of 112 or 113. The scannable latches 112 and 113 may be configured to receive the output, or outputs, from the logic circuits of the chip.

In various embodiments, the first XOR of the first scan channel 114 may be used to hash output data from the first plurality of scannable latches 112. This may be known as using a XOR-based hash functions. The XOR may be used to compute each possible failing location detection point from the exclusive or (XOR) of a subset of the bits in the address. In various embodiments, the output of the hashing of the XOR may be referred to as, but not limited to, returned values, hash codes, hash sums, hamming codes, checksums, or simply hashes. The XOR-based hash function may be used to generate fixed-length output data that acts as a reference to the original data. In various embodiments, the reference may improve speed or efficiency when referencing the output data from the first plurality of scannable latches 112.

In the illustrated embodiment, the output of the first XOR of the first scan channel 114 may then be transmitted into the second XOR of the first scan channel 122. In various embodiments, the second XOR of the first scan channel 122 may be used to hash the output from the first XOR of the first scan channel 114. The output of the second XOR of the first scan channel 122 may be an output 152. Output 152 may be transmitted to a device, system, hardware, software, or firmware for analysis. In other embodiments, output 152 may be stored for later use or analysis.

In the illustrated embodiment, the second XOR of the first scan channel 122 may have data that is transmitted to the rotator 140. In various embodiments, this data may be the same or different from the output 152. In various embodiments, the data received by the rotator 140 may be an indicator, value, or sequence related to the second XOR of the first scan channel 122. The rotator may use the data to output adjustment data from the second XOR of the first scan channel 122 to the second XOR of the second scan channel 125, the adjustment data and rotator are discussed in further detail below.

In the illustrated embodiment, the first XOR of the second scan channel 115 may be used to hash output data from the second plurality of scannable latches 113. This may be similar to the action taken by the first XOR of the first channel 114, and may also be a XOR-based hash function. In various embodiments, the hashing may improve speed or efficiency when referencing the output data from the second plurality of scannable latches 113.

In the illustrated embodiment, the output of the first XOR of the second scan channel 115 may be transmitted into the second XOR of the second scan channel 125. In various embodiments, the second XOR of the second scan channel 125 may be used to hash the output from the first XOR of the second scan channel 115 and may use adjustment data from the rotator 140. The output of the second XOR of the second scan channel 125 may be an output 155 created using the adjustment data from the rotator and output of the first XOR of the second scan channel 115. Output 155 may be transmitted to a device, system, hardware, software, or firmware for analysis. In other embodiments, output 155 may be stored for later use or analysis. In various embodiments, this may be extended to any number of scan channels beyond 104, 105.

Figure 2:
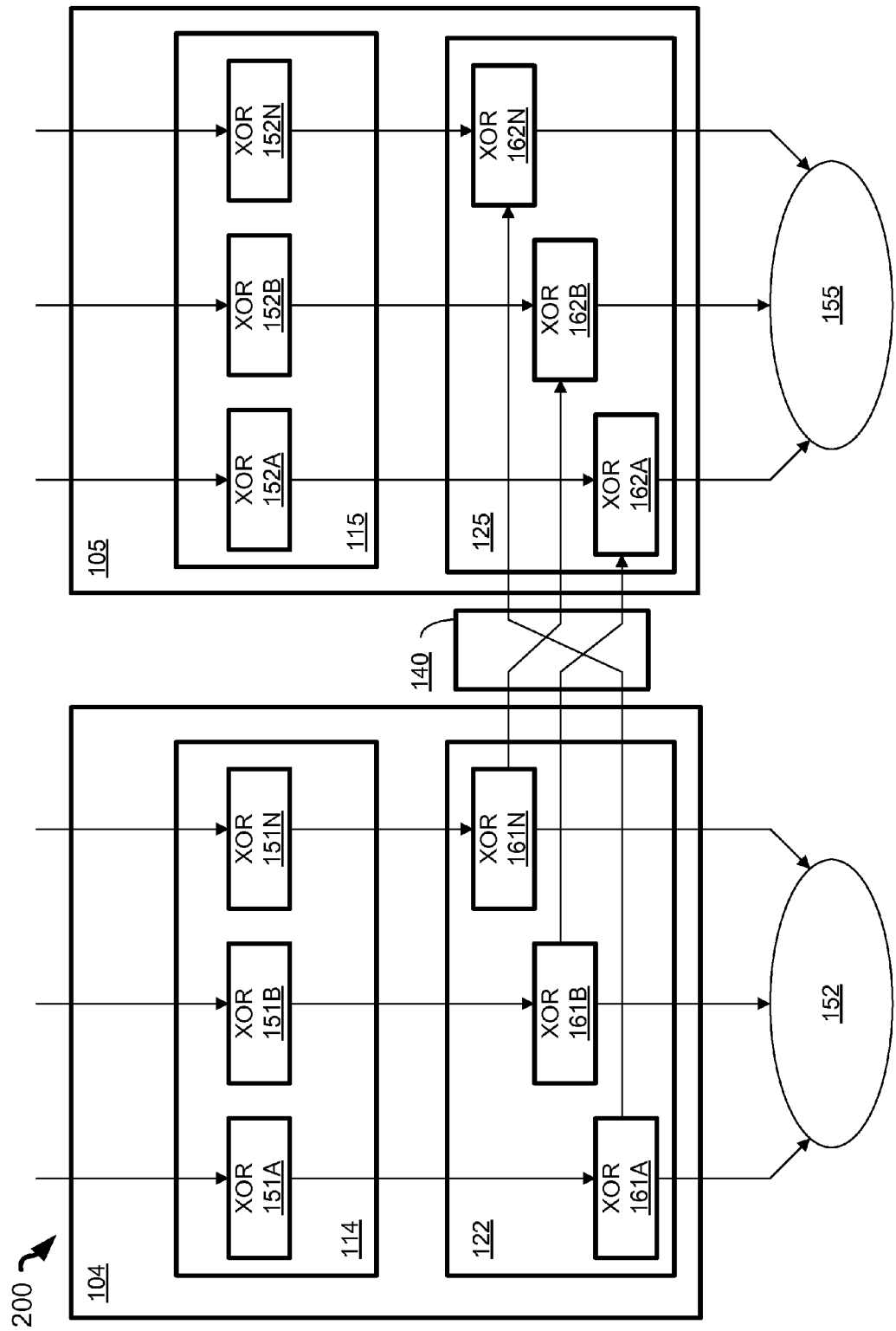
FIG. 2 depicts a high-level block diagram of an exemplary test structure, according to an embodiment.

FIG. 2 illustrates in more detail a test structure 200 that may be used to test scan channels in FIG. 1, first scan channel 104 and second scan channel 105, on a chip. In the illustrated embodiment, first XOR of the first scan channel 114, second XOR of the first scan channel 122, first XOR of the second scan channel 115, and second XOR of the second scan channel 125 each are now plurality of XOR functions. First XOR of the first scan channel 114 may now constitute XOR 151A-151N. Second XOR of the first scan channel 122 may now constitute XOR 161A-161N. First XOR of the second scan channel 115 may now constitute XOR 152A-152N. Second XOR of the second scan channel 125 may now constitute XOR 162A-162N. The rotator 140 may receive data from the serially connected first scan channel 104, here the data may come from the individual XOR 161A-161N of the second XOR of the first scan channel 122. In other embodiments, the data from the first scan channel 104 may come from other elements of the first scan channel 104. The rotator 140 may adjust that data so that the adjustment data it transmits to the second XOR of the second channel 125 is used by the respective XOR 162A-162B with the XOR output of the first XOR of the second scan channel 115. The adjustment data transmitted by the rotator 140 may, in some embodiments, modify the output 155 of the second scan channel 105. In various embodiments, it may rotate, modify, or adjust the output such that the output, or the way the output is presented may be unique and identifiable from the first scan channel, or other scan channels that may be part of the chip.

For example, embodiments may include 32 XORs for respective XORs 151A-151N, 152A-152N, 161A-161N, 162A-162N. This may include 32 XOR 151A-151N and 152A-152N where the XORs may be, but are not limited to, encodes, hamming codes, or hashing for the 32 bit group of the respective scan channels 104 and 105. The second sets of 32 XORs 161A-161N and 162A-162N may be used to adjust the pins the output of the respective scan channels 104 and 105 comes out of in relation to each other. In various embodiments using these sets, the hashing and rotator may be set up such that the outputs 152 and 155 may have numerous non-repeating values. This may allow for quicker or more efficient identification or location of errors or better physical wiring.

In various embodiments, the rotator 140 may receive data from a serially connected first scan channel, such as first scan channel 104. In various embodiments, such as the illustration shown in FIG. 2, may redirect or rotate the input from one XOR in the first scan channel to a non-equivalent XOR in the second scan channel. For example, the rotator illustrated uses the output from XOR 161B of the first scan channel 104 to send the adjustment output to XOR 162A of the second scan channel. This offsetting or rotation of output to receiving XOR may be used to make unique identifiers, codes, or outputs. In various embodiments, the rotator 140 may receive output from one or more elements of the first scan channel 104. In some embodiments, the output may be sent, transmitted, or driven by elements other than an XOR in the first scan channel.

Figure 3:
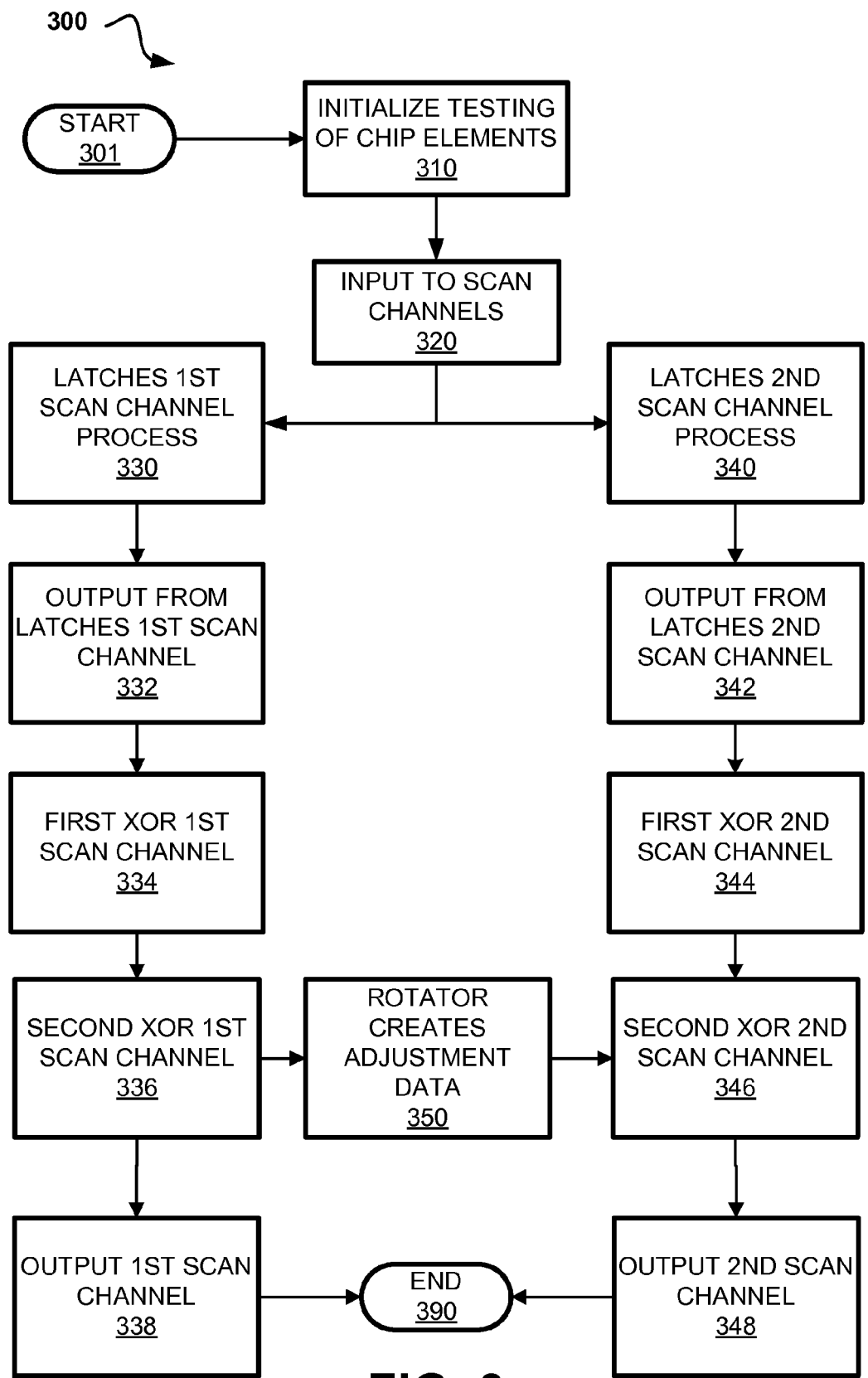
FIG. 3 is a flowchart illustrating a method for testing a chip, according to an embodiment.

FIG. 3 is a flowchart illustrating a method 300 for testing a first and second scan channels. The method 300 may include multiple XORs being used on the output from the scannable latches, such as 112 and 113, for each scan channel and may also include a rotator creating adjustment data using output from the first scan channel, such as 104, and second scan channel, such as 105, using the adjustment data in a second XOR of the second scan channel, such as 125. The method 300 may start at block 301. In block 310, testing is initialized of the chip elements. This testing may include two or more scan channels for circuits on the chip. In various embodiments, the testing may be initialized by a variety of entities internal and external to the chip. For example the testing may be initialized by or due to, but not limited to, a programmed testing schedule, an error in output from the chip being detected, or an external testing device activating a testing cycle. In block 320, input is transmitted into the first and second scan channels. In various embodiments, the transmitted input may be the same for each scan channel or different. In various embodiments, the transmission to the two channels may occur simultaneously or in any sequence.

In block 330, the plurality of scannable latches of the first scan channel 112 may process the input form block 320 through the logic circuits on a chip and receive output data from logic circuits on the chip based upon the input. In block 332, the scannable latches of the first channel 112 may output the received or processed data into other elements of the first scan channel 104. In block 334, the output data of the scannable latches of the first scan channel 112 may be received and processed by the first XOR of the first channel 114. The XOR may hash the output data from the scannable latches of this channel 104, and in other embodiments for other channels. The hashing may improve speed or efficiency when referencing the output data by other elements of the scan channel or elements or devices connected to the scan channel.

In block 336, the hashed output data from the first XOR may be processed by a second XOR of the first scan channel 122. In various embodiments, the second XOR of the first scan channel 122 may be used to hash the output from the first XOR of the first scan channel 114. The output of the second XOR of the first scan channel 122 may be an output 152. In block 338, the output of the first scan channel, output 152, may be transmitted to a device, system, hardware, software, or firmware for analysis. In other embodiments, output 152 may be stored for later use or analysis.

In block 350, the second XOR of the first scan channel 122 may have data that is transmitted to the rotator 140. In various embodiments, this data may be the same or different from the output 152. In various embodiments, the data received by the rotator 140 may be an indicator, value, or sequence related to the second XOR of the first scan channel 122. The rotator may use the data to create output adjustment data from the second XOR of the first scan channel 122 to the second XOR of the second scan channel 125, discussed below.

In block 340, the plurality of scannable latches of the second scan channel 113 may process the input from block 320 through the logic circuits on a chip and receive output data from logic circuits on the chip based upon the input. In block 342, the scannable latches of the second channel 113 may output the received or processed data into other elements of the second scan channel 105. In block 344, the output data of the scannable latches of the second scan channel 113 may be received and processed by the first XOR of the second channel 115. The XOR may hash the output data from the scannable latches. The hashing may improve speed or efficiency when referencing the output data by other elements of the scan channel or elements or devices connected to the scan channel.

In block 346, the hashed output data from the first XOR may be processed by a second XOR of the second scan channel 125. In various embodiments, the second XOR of the first scan channel 122 may be used to hash the output from the first XOR of the first scan channel 114 and may use adjustment data from the rotator 140. The output of the second XOR of the second scan channel 125 may be an output 155 created using the adjustment data from the rotator and output of the first XOR of the second scan channel 115. The adjustment data transmitted by the rotator 140 may, in some embodiments, modify the output 155 of the second scan channel 105. In various embodiments, it may rotate, modify, or adjust the output such that the output, or the way the output is presented may be unique and identifiable from the first scan channel, or other scan channels that may be part of the chip. For example, if first scan channel 104 and second scan channel 105 have errors that would result in the same hash value after the first XOR in each scan channel, the use of the second XOR and the adjustment data from the rotator may result in unique output for the errors for each channel.

The output of the second XOR of the second scan channel 125 may be an output 155. In block 348, the output of the second scan channel, output 155, may be transmitted to a device, system, hardware, software, or firmware for analysis. In other embodiments, output 155 may be stored for later use or analysis. With the output of the first scan channel 104 in block 338 and the output of the second scan channel 105 in block 348 the method may end at block 390.

In various embodiments, the output from the first scan channel 104 to the rotator 140 may come from other elements than the second XOR of the first scan channel 122. For example, the output sent to the rotator 140 may be any element that may send a signal to the rotator 140 that the output 155 of the second scan channel 105 should be differentiated from the output 152 of the first scan channel 104.

In various embodiments, blocks of or steps of method 300 may be absent or more numerous. In various embodiments, the blocks, or steps, may be in a different order or sequential instead of parallel. For example, the illustrated embodiments has the blocks for the first scan channel 104 in parallel to the blocks for the second scan channel 105 in some embodiments, blocks 340-348 may not occur until after block 338 occurs.

While the disclosed subject matter has been described with reference to illustrative embodiments, this description is not intended to be construed in a limiting sense. Various modifications of the illustrative embodiments, as well as other embodiments of the subject matter, which are apparent to persons skilled in the art to which the disclosed subject matter pertains are deemed to lie within the scope and spirit of the disclosed subject matter.

What is claimed is:

1. A system for testing a chip comprising:
   a first plurality of scannable latches on a first scan channel, the first plurality of scannable latches configured to apply first input data to logic circuits on the chip and further configured to receive first output data from the to logic circuits on the chip;
   a second plurality of scannable latches on a second scan channel, the second plurality of scannable latches configured to apply second input data to the logic circuits on the chip and further configured to receive second output data from the logic circuits on the chip;
   a first XOR on the first scan channel, the first XOR on the first scan channel configured to hash output data from the first plurality of scannable latches;
   a first XOR on the second scan channel, the first XOR on the second scan channel configured to hash output data from the second plurality of scannable latches;

a second XOR on the first scan channel, the second XOR on the first scan channel configured to hash output from the first XOR on the first scan channel;

a rotator configured to receive output data from the second XOR on the first scan channel and further configured to create adjustment data for transmittal to the second scan channel; and a second XOR on the second channel, the second XOR on the second scan channel configured to hash the adjustment data and output data from the first XOR on the first scan channel.

2. The system of claim 1, wherein the first XOR on the second scan channel comprises a plurality of XORs.

3. The system of claim 1, wherein the second XOR on the second scan channel comprises a plurality of XORs.

4. The system of claim 1, wherein the first input data is different from the second input data.

5. The system of claim 1, wherein a quantity of logic circuits on the chip is different from a quantity of scannable latches on the first scan channel.

6. The system of claim 1, wherein a quantity of logic circuits on the chip is different from a quantity of scannable latches on the second scan channel.

7. The system of claim 1, wherein the output data from the first XOR on the first scan channel comprises fixed-length data referencing the output data from the first scan channel.

8. The system of claim 1, wherein the output data from the second XOR on the first scan channel is selected from the group consisting of:

an indicator related to the second XOR on the first scan channel;

a value related to the second XOR on the first scan channel; and a sequence related to the second XOR on the first scan channel.

9. The system of claim 1, wherein the first XOR on the first scan channel and the first XOR on the second scan channel are further configured to hash in a similar manner.

10. The system of claim 1, wherein the second XOR on the first scan channel comprises a first set of XORs, wherein the second XOR on the second scan channel comprises a second set of XORs, wherein each member in the first set has an equivalent member in the second set, and wherein the rotator redirects output data from a first member of the first set to a second member of the second set, the second member not being the equivalent member of the first member.

11. The system of claim 10, wherein the first XOR on the first scan channel comprises a third set of XORs, wherein each member in the third set has an equivalent member in the first set, and wherein output data from a third member of the third set is directed to the first member, the third member being the equivalent member of the first member.

12. The system of claim 1, wherein the second XOR on the first scan channel comprises a first set of XORs, wherein the second XOR on the second scan channel comprises a second set of XORs, wherein each member in the first set has an equivalent member in the second set, and wherein the rotator redirects output data from each member of the first set to a non-equivalent member of the second set.

13. The method of claim 12, wherein the first XOR on the first scan channel comprises a third set of XORs, wherein each member in the third set has an equivalent member in the first set, and wherein output data from each member of the third set is directed to the equivalent member of the first set.

* * * * *